United States Patent [19]
Tomatsuri et al.

[11] Patent Number: 6,078,202
[45] Date of Patent: Jun. 20, 2000

[54] SEMICONDUCTOR DEVICE HAVING PORTIONS THAT OPERATE AT DIFFERENT FREQUENCIES, AND METHOD OF DESIGNING THE DEVICE

[75] Inventors: Hideaki Tomatsuri; Hiroyuki Fujiyama; Noriaki Ono; Minoru Usui, all of Kawasaki, Japan

[73] Assignee: Fujitsu Limited, Kawasaki, Japan

[21] Appl. No.: 09/134,518

[22] Filed: Aug. 14, 1998

[30] Foreign Application Priority Data

Apr. 28, 1998 [JP] Japan .................................. 10-119337

[51] Int. Cl.[7] ...................................................... H03L 7/00
[52] U.S. Cl. ............................................................. 327/145
[58] Field of Search .................................... 327/115, 116, 327/117, 118, 119, 120, 122, 144, 145

[56] References Cited

U.S. PATENT DOCUMENTS

5,361,290 11/1994 Akiyama .................................. 377/47
5,528,181 6/1996 Suggs ...................................... 327/115

*Primary Examiner*—Jeffrey Zweizig
*Attorney, Agent, or Firm*—Arent Fox Kinter Plotkin & Kahn PLLC

[57] ABSTRACT

Disclosed are a semiconductor device of which a block having a plurality of portions that operate based on a plurality of clocks can be designed and inspected easily, and a method of designing the semiconductor device. First and second clocks whose frequencies are mutually different are used to generate an enabling signal that is validated only during a short period including a transition edge of the second clock. The enabling signal and first clock are supplied to the second portion. The second portion synthesizes the enabling signal and first clock to substantially generate the second clock. Thus, the second portion is regarded as a portion that operates synchronously with the first clock.

5 Claims, 9 Drawing Sheets

Fig.3
PRIOR ART (1) FOR FIRST CLOCK
```
ALWAYS @ (POSEDGE CLK1)
    BEGIN
        IF (⁻RSTX)
            BEGIN
                STATE1 <= #1 3' b000;
            END
        ELSE
            BEGIN
                CASE (STATE1)
                    3'b000:
                        BEGIN

END
    END
```

(2) FOR SECOND CLOCK
```
ALWAYS @ (POSEDGE CLK2)
    BEGIN
        IF (⁻RSTX)
            BEGIN
                STATE2 <= #1 3' b000;
            END
        ELSE
            BEGIN
                CASE (STATE2)
                    3'b000:
                        BEGIN

END
    END
```

```
always @(posedge CLK1)
    begin
        if(~RSTX)
            begin
                state <= #1 3'b000 ;
            end
        else
            begin
                case(state)
                    3'b000 :
                        begin
                            if(EN==1'b1)
                                begin
                                    state <= #1 3'b001 ;
                                end
                        end
                    3'b001 ;
                        begin end
```

Fig.9

SEMICONDUCTOR DEVICE HAVING PORTIONS THAT OPERATE AT DIFFERENT FREQUENCIES, AND METHOD OF DESIGNING THE DEVICE

BACKGROUND OF THE INVENTION

1. Field of the Invention

The present invention relates to a semiconductor device having a plurality of portions that operate based on a plurality of clocks of different frequencies, and a method of designing the semiconductor device. More particularly, this invention is concerned with a semiconductor device having an internal block that operates at a high speed and a block that operates at a low speed and interfaces with outside circuits, and a method of designing the semiconductor device.

2. Description of the Related Art

In recent years, semiconductor devices have been designed to operate at higher speeds. This trend is even more obvious in CPUs. The operating speeds of internal components of the CPU may be raised but it is hard for external devices, including semiconductor devices connected to the CPU and various input and output units, to operate at the same speed as the CPU. For this reason, an interface block is often included as a peripheral LSI to be incorporated in or connected to the CPU. The interface block links a portion that operates based on a first high-frequency clock and a portion that operates based on the second low-frequency clock. In the interface block, therefore, portions that operate synchronously with two clocks of different frequencies coexist.

As far as a circuit having two portions that operate based on clocks of different frequencies is concerned, it is designed on the assumption that there are two blocks that operate synchronously with two clocks. Specifically, the circuit is designed on the assumption that there are two different clock sources and there are two portions that operate synchronously with two different clocks. When a plurality of clocks of different frequencies exist in one block, circuits that operate synchronously with different clocks coexist in the block. Moreover, internal control signals make a transition according to complex timing. This poses a problem that it becomes more difficult to inspect the timing than when the circuit is designed on the condition that only one clock is used. Besides, when a block has portions that operate synchronously with a plurality of clocks, every time such a block is designed, the plurality of portions must be prepared in one-to-one correspondence with the clocks.

Assume that a block is designed to include a plurality of state machines which operate based on a plurality of clocks. In this case, the descriptions of the operations of the block and the capabilities thereof including an RTL (register transfer level) to be written with a hardware description language HDL become complex. Besides, the number of uncertain elements increases. This poses a problem that the possibility of an occurrence of a drawback becomes more likely.

SUMMARY OF THE INVENTION

An object of the present invention is to make it possible to easily design and inspect a block having a plurality of portions that operate based on a plurality of clocks.

A semiconductor device of the present invention generates an enabling signal, which is validated only during a short period including a transition edge of a second clock, using first and second clocks of different frequencies, and supplies the enabling signal and first clock to a second portion. The second portion synthesizes the enabling signal with the first clock to substantially generate a second clock. The second portion can thus be designed as a portion that operates synchronously with the first clock. This leads to simple design and inspection.

When the frequency of the second clock is lower than that of the first clock and calculated by dividing the frequency of the first clock, a frequency divider is included.

For realizing the second portion with a state machine, the enabling signal is used as a condition for a state transition to be made by the state machine equivalent to the second portion.

According to the present invention, the first portion that operates synchronously with the first clock and the second portion that operates synchronously with the second clock can be designed and inspected as portions that operate synchronously with the first clock that is used in common.

In particular, when the second portion is realized with a state machine, the enabling signal is used as the condition for a state transition to be made by the state machine. This leads to a simple design.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

Before proceeding to a detailed description of the preferred embodiments, prior art circuits having portions which operate based on clocks of different frequencies will be described with reference to the accompanying drawings for a clearer understanding of the differences between the prior art and the present invention.

Figure 1:
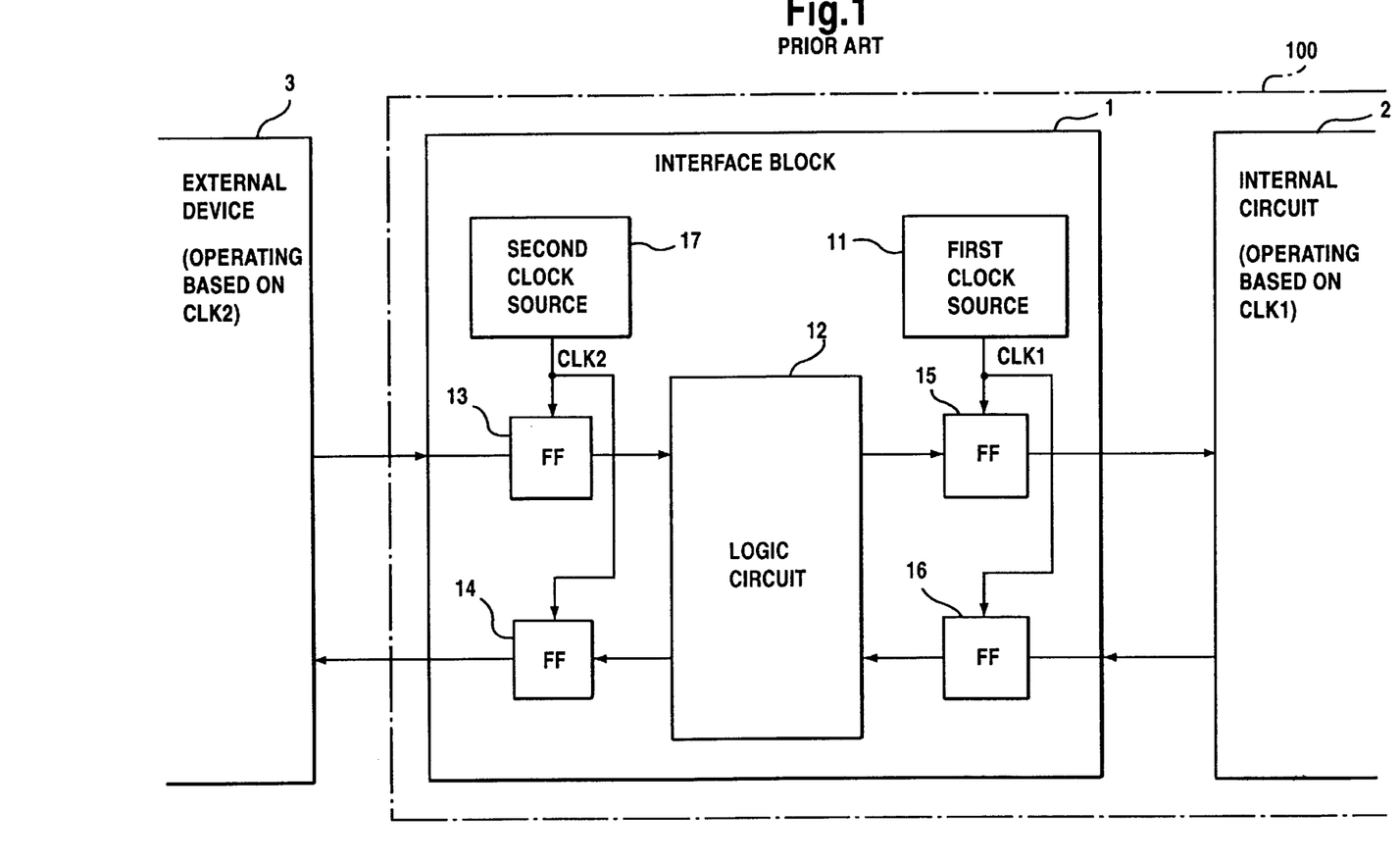
FIG. 1 is a diagram showing a configuration of a circuit of a prior art, which operates based on clocks of different frequencies.

FIG. 1 is a diagram showing a configuration of an interface block in accordance with a prior art. In FIG. 1, a portion denoted by reference numeral 100 is a CPU. The CPU 100 is provided with an interface block 1 and an internal circuit 2 that operates synchronously with a first high-frequency clock CLK1. An external device 3 is a portion that operates synchronously with a second clock CLK2 having a frequency lower than the frequency of the first clock CLK1. The interface block 1 adjusts timing so that input or output of data can be achieved between the internal circuit 2 and external device 3 which operate based on different clocks. As illustrated, the interface block 1 comprises a first clock source 11 for outputting the first clock CLK1, a second clock source 17 for outputting the second clock CLK2, a logic circuit 12, a flip-flop (FF) 13 for latching data sent from the external device 3 synchronously with the second clock CLK2, an FF 14 for latching data sent from the logic circuit 12 synchronously with the second clock CLK2 and holding the data so that it can be output to the external device 3, an FF 15 for latching data sent from the logic circuit 12 synchronously with the first clock CLK1 and holding the data so that it can be output to the internal circuit 2, and an FF 16 for latching data sent from the internal circuit 2 synchronously with the first clock CLK1. The first clock source 11 is, for example, a buffer for buffering the first clock CLK1 supplied from the internal circuit 2. The second clock source 17 is, for example, a frequency divider for dividing the frequency of the first clock CLK1 output from the first clock source 11, a buffer for buffering the second clock CLK2 supplied from the external device 3, or a PLL (phase locked loop) for inputting the second clock CLK2 supplied from the external device 3. Moreover, only the FFs 13 to 16 are illustrated as circuit elements to which the first and second clocks are applied. In addition, gates or the like that operate synchronously with the clocks may be included. When the interface block 1 is a circuit for merely inputting or outputting data, only the FFs are included as illustrated. However, in reality, data may or may not be latched depending on a state. The interface block 1 is therefore generally provided with a control circuit for controlling such an operation.

Figure 2:
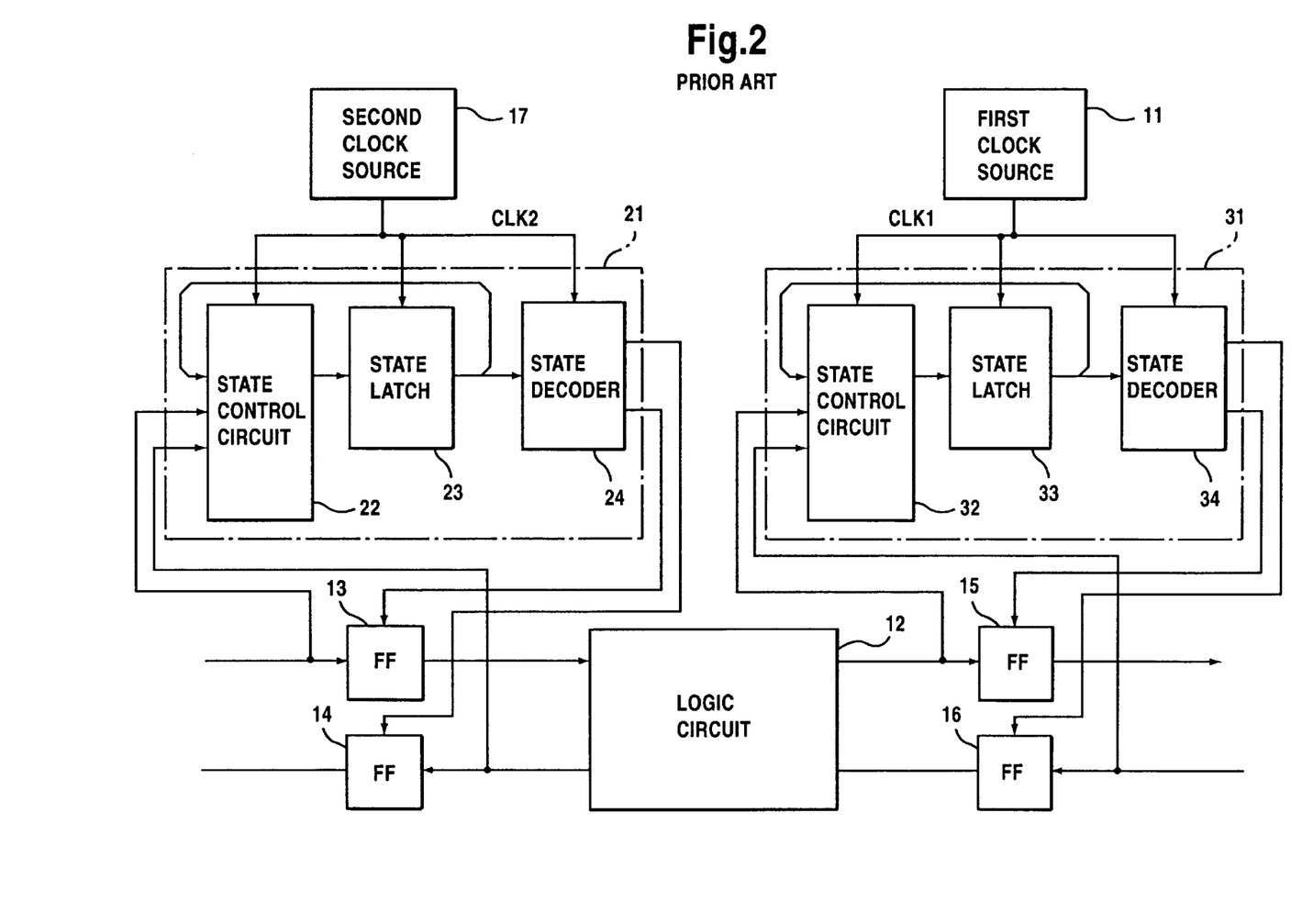
FIG. 2 is diagram showing a configuration of a state machine in accordance with the prior art.

A circuit for making a state transition according to a state attained when a clock is input and for varying an output signal is generally referred to as a state machine and widely adopted. FIG. 2 is a diagram showing a configuration in which the state machine is employed in the interface block in accordance with the prior art shown in FIG. 1. The configuration includes a first state machine 31 that operates synchronously with the first clock CLK1, and a second state machine 21 that operates synchronously with the second clock CLK2. Like an ordinary state machine, the second state machine 21 comprises a state control circuit 22 for calculating data indicating the next transitive state according to the state of the state machine and the state of another portion, a state latch 23 for latching and holding state data output from the state control circuit 22, and outputting data to the state control circuit 22, and a state decoder 24 for outputting a control signal according to the state data output at that time from the state latch 23. The control signal output from the state decoder 24 is applied to the FFs 13 and 14. In the drawing, data input to the FFs 13 and 14 is input to the state control circuit 22. Aside from the data, data output from the FFs 13 and 14 or data output from another portion may be input thereto. The first state machine 31 has the same components as the foregoing components.

For designing a circuit having two portions that operate based on clocks of different frequencies like the foregoing circuit, it has been considered that the circuit would include, as shown in FIGS. 1 and 2, two blocks that operate synchronously with two clocks. In other words, the circuit has been designed to include two different clock sources 11 and 17, and two portions that are composed of the circuit elements 13 and 14, and 15 and 16 respectively and operate synchronously with two different clocks CLK1 and CLK2. In short, the circuit has been designed on the assumption that it would include two state machines 21 and 22 that operate synchronously with the clocks CLK1 and CLK2.

Figure 3:
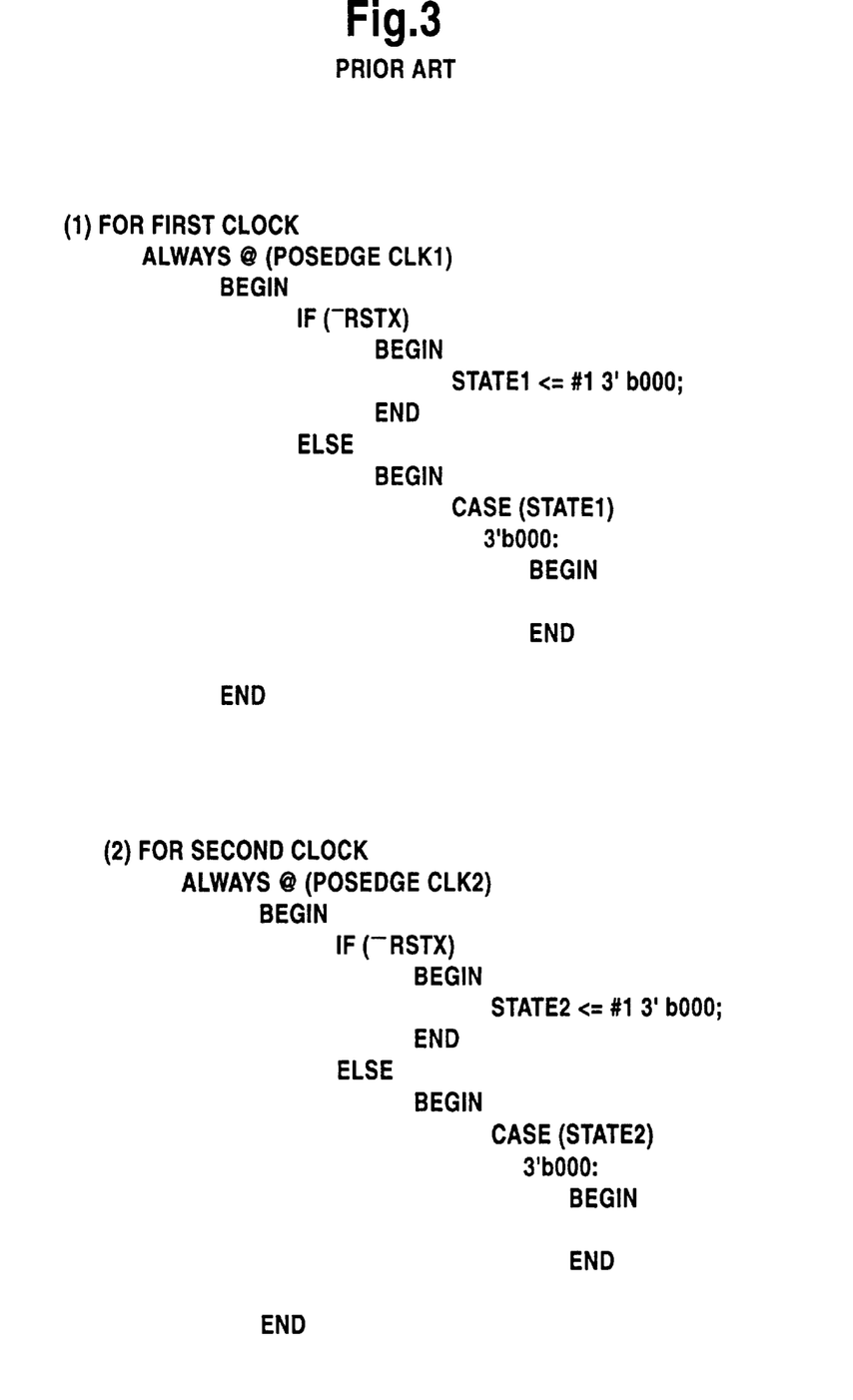
FIG. 3 is diagram showing examples of descriptions of an RTL that is a functional level of the configuration of the prior art.

FIG. 3 is a diagram showing descriptions of an RTL of the configuration shown in FIG. 2 in accordance with the prior art. In FIG. 3, (1) shows a description of the first state machine that operates synchronously with the first clock CLK1, and (2) shows a description of the second state machine that operates synchronously with the second clock CLK2. Thus, the two state machines have been described separately in the past.

Assume that a block is, as shown in FIG. 3, designed to include a plurality of state machines that operate based on a plurality of clocks. In this case, the descriptions of the operations of the block and the capabilities thereof including an RTL (register transfer level) to be written with a hardware description language HDL will become complex. Besides, the number of uncertain elements will increase. This poses a problem that the possibility of an occurrence of a drawback will become likely.

Figure 4:
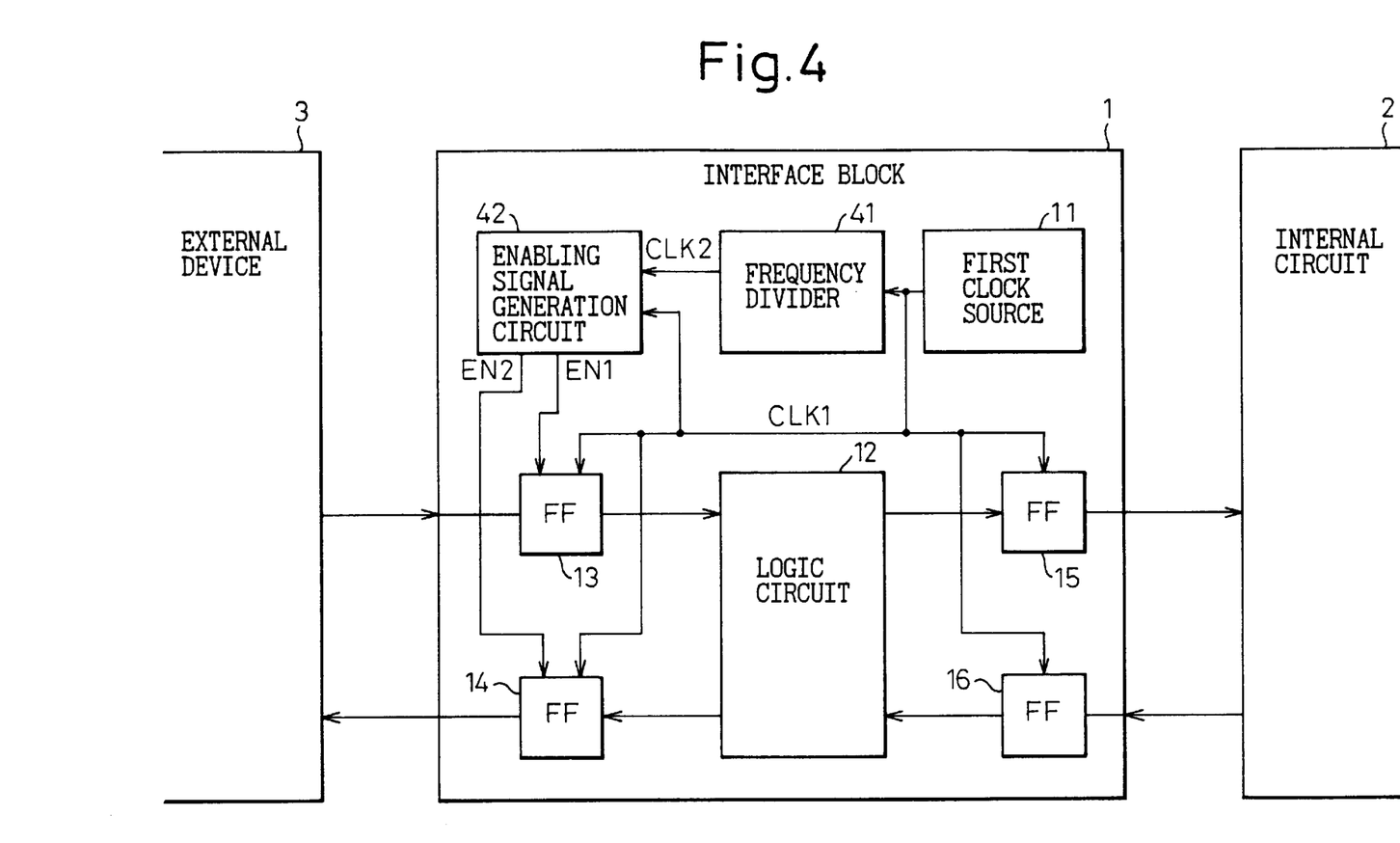
FIG. 4 is a diagram showing a configuration of an interface block in accordance with the first embodiment of the present invention.

FIG. 4 is a diagram showing a configuration of an interface block in accordance with the first embodiment of the present invention. The first embodiment is an embodiment where a second clock CLK2 is synchronous with a first clock CLK1, and the second clock CLK2 is produced by dividing in frequency the first clock CLK1. Unlike the interface block 1 of the prior art shown in FIG. 1, the interface block 1 of the first embodiment does not include the second clock source 17 but has a frequency divider 41 and an enabling signal generation circuit 42. A difference from the interface block 1 of the prior art lies in a point that the first clock CLK1 and enabling signals EN1 and EN2 output from the enabling signal generation circuit 42 are supplied to the flip-flops (FFs) 13 and 14. The other components are identical to those of the prior art shown in FIG. 1 which have already been described. The FFs 13 and 14 latch data synchronously with the first clock CLK1 only when the enabling signals EN1 and EN2 are active.

Figure 5:
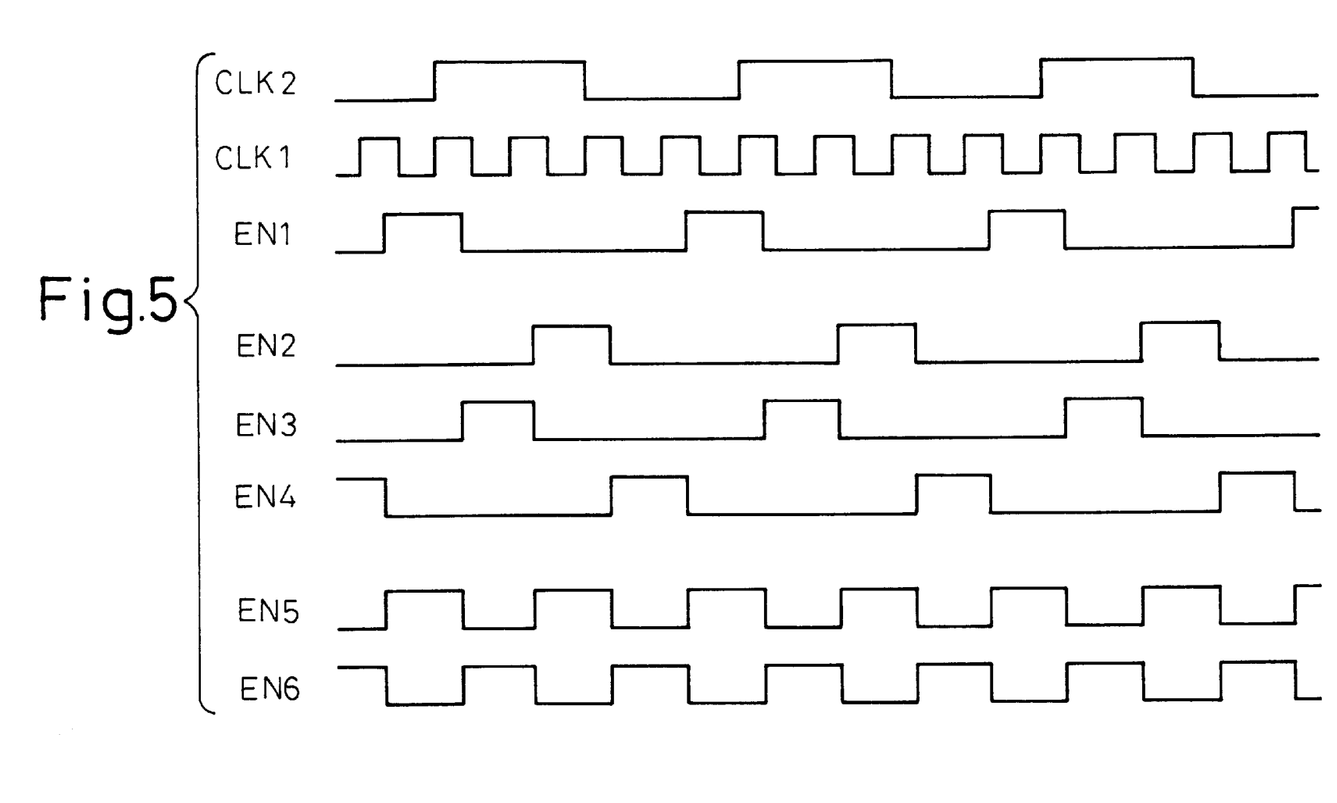
FIG. 5 is a diagram showing an example of enabling signals in accordance with the first embodiment.

As shown in FIG. 4, the enabling signal generation circuit 42 generates an enabling signal using the first clock CLK1 and second clock CLK2. FIG. 5 is a diagram showing an example of enabling signals to be generated by the enabling signal generation circuit 42. As illustrated, the clock CLK2 is a clock whose frequency is a quarter of the frequency of the clock CLK1, and is therefore produced by quartering in frequency the clock CLK1. Herein, an enabling signal whose duration agrees with one cycle of the clock CLK1 and which is generated at the leading edge of the clock CLK2 output from the frequency divider 41 is the enabling signal EN1. An enabling signal whose duration agrees with one cycle of the clock CLK1 and which is generated at the trailing edge of the clock CLK2 is the enabling signal EN2. These enabling signals are employed. The enabling signal EN1 is supplied to the FF 13, while the enabling signal EN2 is supplied to the FF 14. When the enabling signal EN1 is active high, the FF 13 latches data input from the external device 3 synchronously with the clock CLK1. Moreover, when the enabling signal EN2 is active high, the FF 14 latches data to be output to the external device 3 synchronously with the clock CLK1. In other words, input data from the external device 3 is fetched synchronously with the leading edge of the clock CLK2. Output data to the external device 3 makes a transition synchronously with the leading edge of the clock CLK2.

Herein, the enabling signals EN1 and EN2 alone are employed. If necessary, the enabling signal generation circuit 42 generates enabling signals EN3 and EN4 that are out of phase with the enabling signals EN1 and EN2 by one cycle of the clock CLK1, and uses the enabling signals. Moreover, when the phase of the second clock CLK2 generated by dividing in frequency the first clock CLK1, and the phase of a clock in the external device 3 are uncertain, the enabling signals EN1 to EN4 may be generated. According to a phase difference from the clock in the external device 3, any of the enabling signals EN1 to EN4 may be selected for use.

Moreover, the foregoing example is concerned with the enabling signals to be generated when the frequency of the clock CLK2 is a quarter of that of the clock CLK1. Alternatively, the frequency of the clock CLK2 may be a half of that of the clock CLK1. In this case, the enabling signal generation circuit 42 generates illustrated enabling signals EN5 and EN6.

Figure 6:
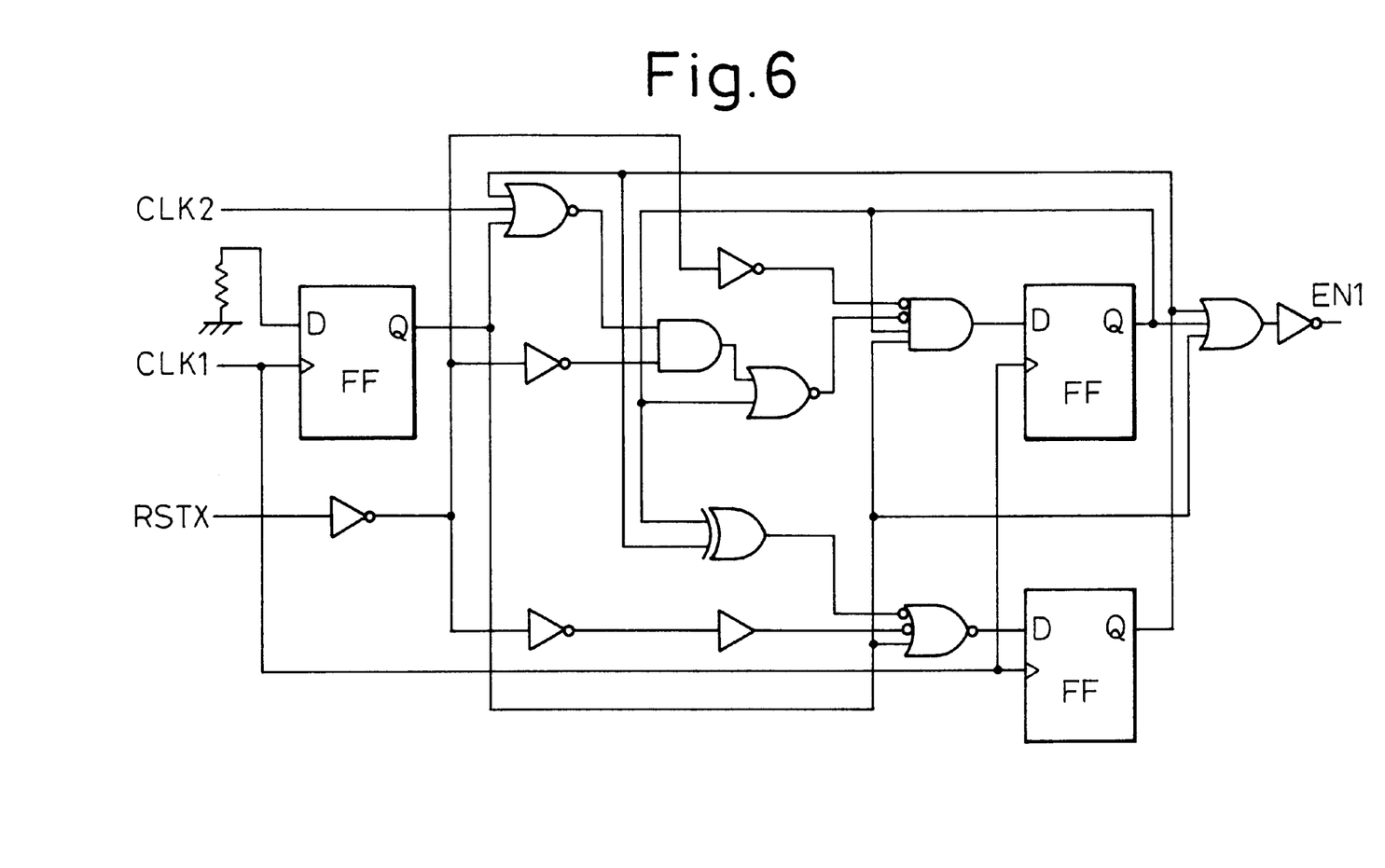
FIG. 6 is a diagram showing an example of a configuration of an enabling signal generation circuit (x4 mode)

FIG. 6 is a diagram showing a configuration of a circuit portion of the enabling signal generation circuit 42 for generating the enabling signal EN1 using the clocks CLK1 and CLK2. The details will be omitted. With input of the clocks CLK1 and CLK2, the enabling signal EN1 is output. Reference symbol RSTX denotes a reset signal.

Figure 7:
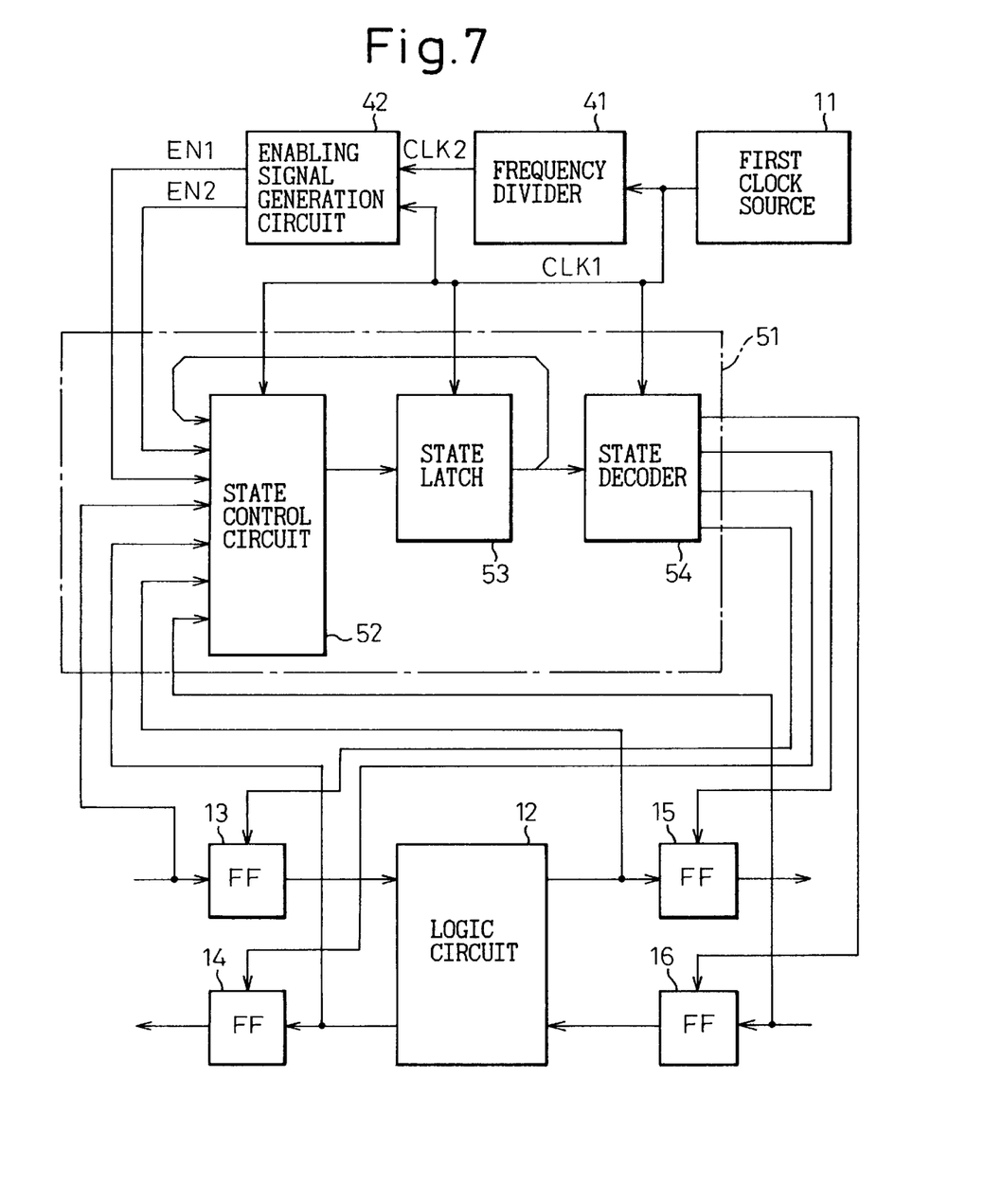
FIG. 7 is a diagram showing a configuration of a state machine in accordance with the first embodiment.

FIG. 7 shows a configuration where the interface block 1 shown in FIG. 4 is designed as a state machine. As illustrated, the interface block 1 of the first embodiment is provided with one state machine 51. In addition to an output of a state latch 53 and data to be input to the FFs 13 to 16, enabling signals EN1 and EN2 output from the enabling signal generation circuit 42 are input to a state control circuit 52 in the state machine 51. The state control circuit 52 changes control state data using the enabling signals EN1 and EN2 as state variables. A state decoder 54 outputs a signal for controlling latching by the FFs 13 to 16 according to the state data.

Figure 8:
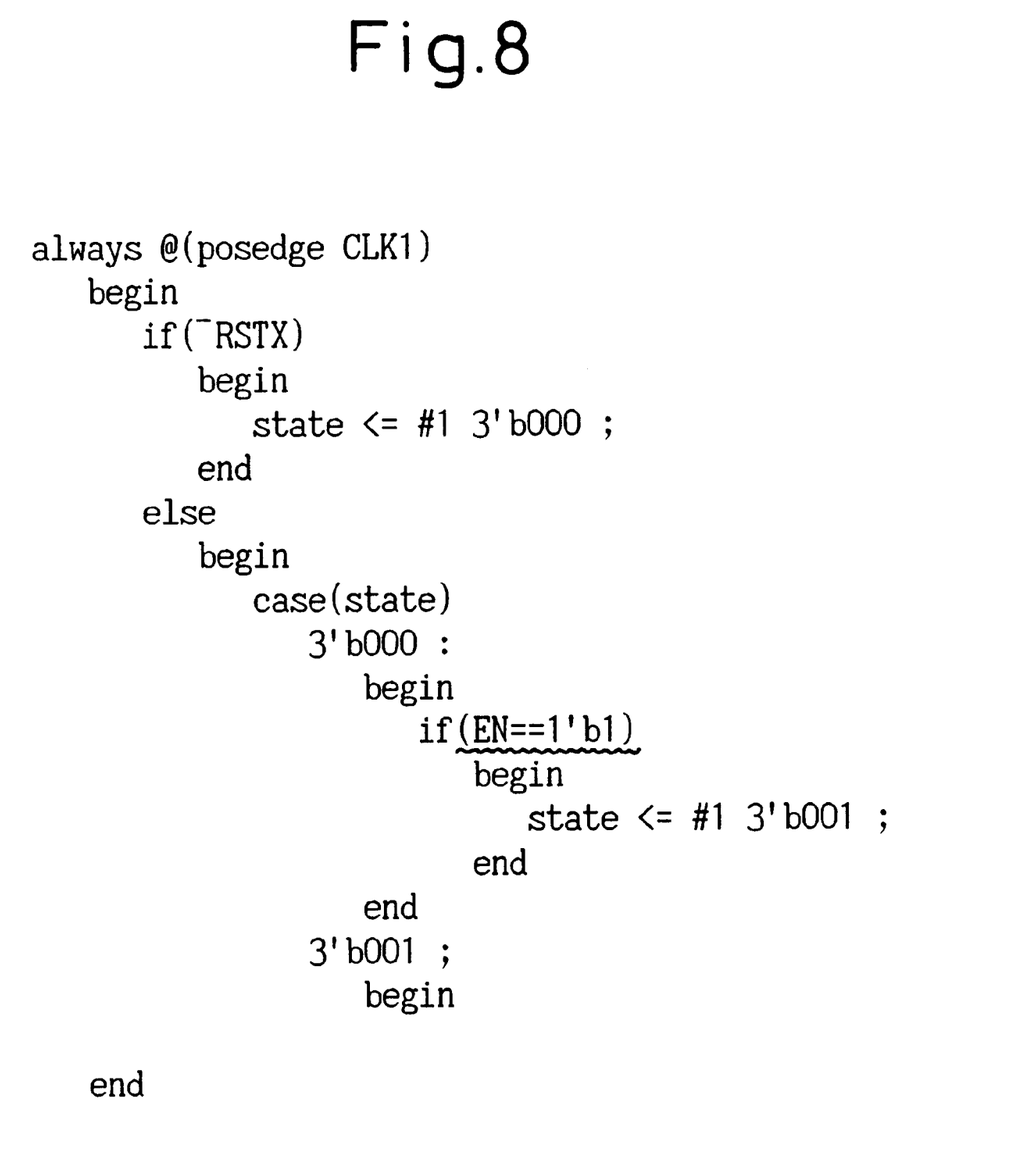
FIG. 8 is a diagram showing an example of a description of an RTL that is a functional level of the configuration of the first embodiment.

FIG. 8 is a diagram showing an example of a description of an RTL of the interface block 1 shown in FIG. 7. One state machine that operates synchronously with a common clock CLK1 is described.

As mentioned above, according to the first embodiment of the present invention, the portion (state machine) that operates synchronously with the second clock CLK2 according to the prior art can be regarded as the portion (state machine) that operates synchronously with the first clock CLK1. This leads to simple design. Moreover, according to the first embodiment, the frequency divider 41 is also a portion that operates synchronously with the first clock CLK1. The enabling signal generation circuit 42 can be regarded as a portion that operates synchronously with a signal from the clock CLK1. All the circuits can therefore be regarded as circuits that operate synchronously with the first clock CLK1.

In the first embodiment, the second clock CLK2 is produced by dividing in frequency the first clock CLK1. This is possible when the CPU 100 including the interface block 1 and internal circuit 2 and the external device 3 share the same clock source, and a frequency-divided signal is supplied to the external device 3. However, the present invention is not limited to this mode. The present invention can also apply to a mode where the internal circuit 2 and external device 3 operate synchronously with two clocks that are not mutually synchronous.

Figure 9:
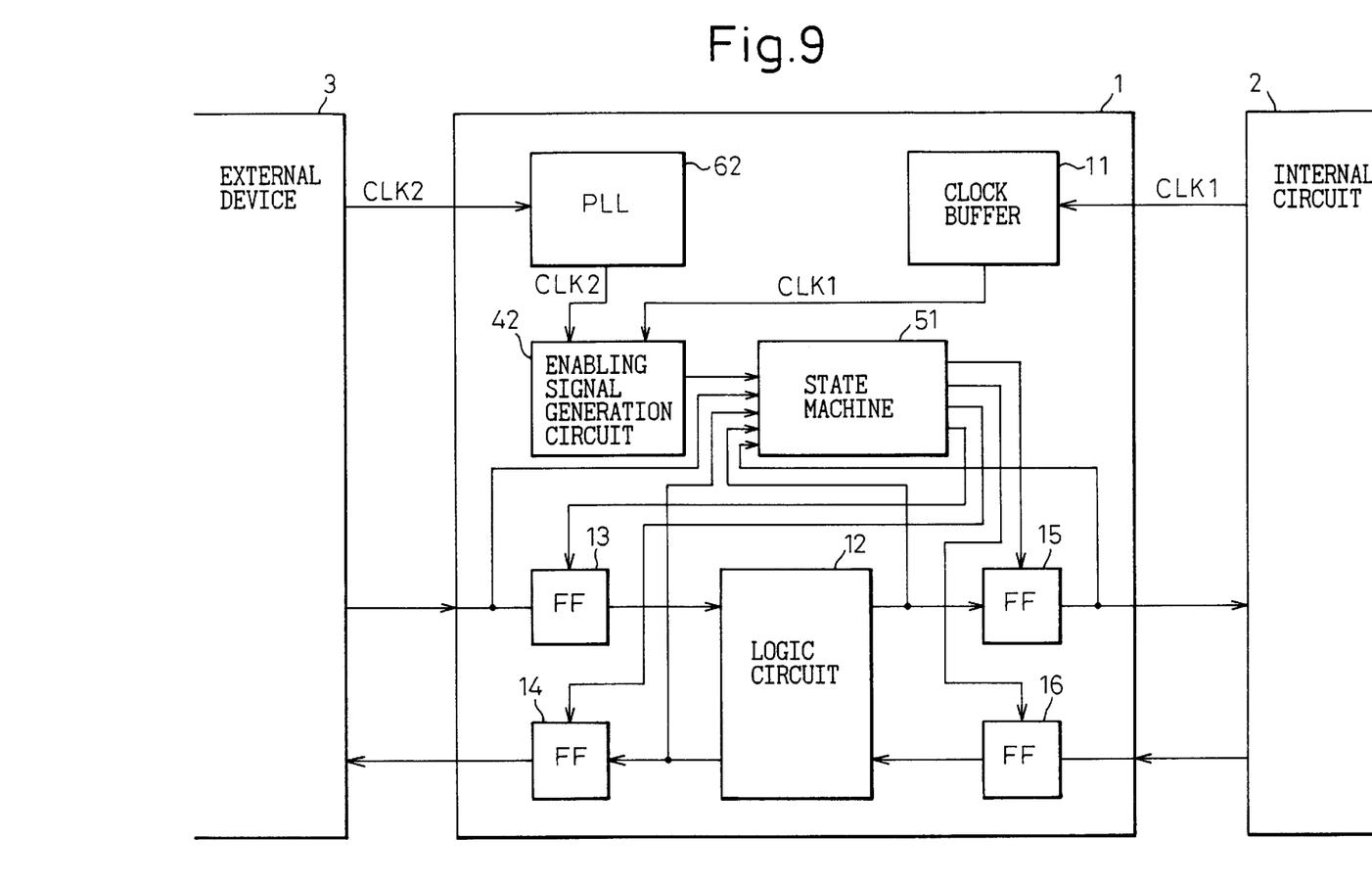
FIG. 9 is a diagram showing a configuration of an interface block in accordance with the second embodiment of the present invention.

FIG. 9 is a diagram showing a configuration of an interface block 1 in accordance with the second embodiment. A difference from the first embodiment lies in a point that a PLL 62 for generating a second clock CLK2 that does not lag behind a clock supplied from the external device 3 and has the same frequency as the clock is substituted for the frequency divider 41. A clock buffer for buffering the first clock CLK1 supplied from the internal circuit 2 is used as the first clock source 11. The other components are identical to those of the first embodiment.

In the second embodiment, the PLL 62 is included for generating the second clock CLK2 that does not lag behind a clock supplied from the external device 3 and has the same frequency as the clock. As long as a phase delay poses no problem, a buffer may be substituted for the PLL 62.

As described so far, according to the present invention, even when a block has a plurality of portions that operate based on a plurality of clocks, the block can be designed and inspected on the assumption that the portions operate based on a single clock. The design and inspection can therefore be achieved easily. Eventually, the development cost can be reduced.

What is claimed is:

1. A semiconductor device having a first portion that operates synchronously with a first clock, and a second portion that operates synchronously with the first clock, said semiconductor device comprising:

an enabling signal generation circuit for generating an enabling signal, which is validated only during a short period including a transition edge of a second clock at which the state of said second portion is changed, using said first and second clocks, said first clock and enabling signal being supplied to said second portion.

2. A semiconductor device according to claim 1, further comprising a frequency divider for dividing in frequency said first clock so as to generate said second clock.

3. A semiconductor device according to claim 1, wherein said second portion comprises a state machine and uses said enabling signal as a condition for state transition to be made by the state machine.

4. A method of designing a semiconductor device having a first portion that operates synchronously with a first clock, a second portion that operates synchronously with the first clock, and an enabling signal generation circuit for generating an enabling signal that is validated only during a short period including a transition edge of a second clock at which the state of said second portion is changed, said first clock and enabling signal being supplied to said second portion, and said first portion and second portion are designed as portions that operate synchronously with said first clock.

5. A method of designing a semiconductor device according to claim 4, wherein said second portion comprises a state machine, and said enabling signal is used as a condition for state transition to be made by the state machine.

* * * * *